United States Patent
Bode

(10) Patent No.: US 9,124,277 B2
(45) Date of Patent: Sep. 1, 2015

(54) SYSTEM AND METHOD FOR CLOCK SIGNAL GENERATION

(75) Inventor: Hubert Bode, Haar (DE)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 14/111,775

(22) PCT Filed: Apr. 20, 2011

(86) PCT No.: PCT/IB2011/051717
§ 371 (c)(1),
(2), (4) Date: Oct. 15, 2013

(87) PCT Pub. No.: WO2012/143758
PCT Pub. Date: Oct. 26, 2012

(65) Prior Publication Data
US 2014/0035638 A1    Feb. 6, 2014

(51) Int. Cl.
*H03L 7/06* (2006.01)
*H03L 7/08* (2006.01)
*H03L 7/197* (2006.01)
*H03L 7/183* (2006.01)

(52) U.S. Cl.
CPC ... *H03L 7/08* (2013.01); *H03L 7/183* (2013.01); *H03L 7/1974* (2013.01)

(58) Field of Classification Search
None
See application file for complete search history.

(56) References Cited

U.S. PATENT DOCUMENTS

| 5,808,494 | A | 9/1998 | Chang et al. |
| 6,275,553 | B1 * | 8/2001 | Esaki ............... 375/371 |
| 6,509,769 | B2 * | 1/2003 | Dauth ............... 327/156 |
| 6,515,530 | B1 * | 2/2003 | Boerstler et al. .... 327/291 |
| 7,151,399 | B2 * | 12/2006 | Kaizuka ............. 327/295 |
| 7,495,517 | B1 | 2/2009 | Hoang et al. |
| 8,466,723 | B2 * | 6/2013 | Klapproth et al. .... 327/144 |
| 2005/0184773 | A1 | 8/2005 | Boyko et al. |
| 2007/0001882 | A1 | 1/2007 | Zhang et al. |
| 2008/0231331 | A1 | 9/2008 | Balraj et al. |
| 2009/0153194 | A1 | 6/2009 | Cumming et al. |
| 2010/0073035 | A1 | 3/2010 | Dani et al. |

FOREIGN PATENT DOCUMENTS

EP    1953918 A1    8/2008

OTHER PUBLICATIONS

International Search Report and Written Opinion correlating to PCT/IB2011/051717 dated Nov. 25, 2011.
Supplementary European Search Report mailed Sep. 17, 2014 for correlating EP Application No. 11863964.0, 6 pages.

* cited by examiner

*Primary Examiner* — Cassandra Cox

(57) ABSTRACT

A clock signal generation system is provided that includes a clock signal generating circuit arranged to provide a first clock signal having a selectable first clock rate; a divider circuit connected to receive the first clock signal and arranged to generate, depending on a division factor, a second clock signal from the first clock signal, having a constant second clock rate and being synchronized with the first clock signal; and a controller module connected to the divider circuit and arranged to change the division factor when a different first clock rate is selected, to keep the second clock rate constant and the second clock signal synchronized with the first clock signal.

20 Claims, 3 Drawing Sheets

SYSTEM AND METHOD FOR CLOCK SIGNAL GENERATION

FIELD OF THE INVENTION

This invention relates to a clock signal generation system and a method for clock signal generation.

BACKGROUND OF THE INVENTION

Reduction of power consumption of electronic systems is an important aspect of the development of, for example, automotive electronic systems provided with modern vehicles. A typical approach for reducing power consumption is to temporarily switch off some of the systems or parts of them, for example by applying power-gating techniques.

Another approach is to reduce power consumption when in run mode, i.e. when an electronic system cannot be switched off safely. For example, power consumption of modern automotive electronic control units (ECUs) may be reduced also in run mode by reducing the clock frequency, i.e. the clock rate, applied to the ECU or for example a microcontroller of the ECU.

This may be achieved by providing a clock frequency to a microcontroller core, which may be variable or selectable, depending on the task to be carried out by the microcontroller. Changing the clock rate applied to the microcontroller core may usually also change the clock rate of the clock signals applied to peripheral components, such as for example serial interfaces, timers, analog-to-digital converters etc. If a constant, i.e. fixed, clock rate may be required for peripheral components, additional clock generating circuits may provide clock signals to peripheral components. To allow for synchronization with the clock signal applied to the microcontroller core, synchronizer logic circuits may be used.

SUMMARY OF THE INVENTION

The present invention provides a clock signal generation system and a method for clock signal generation as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, as illustrated, for the understanding and appreciation of the underlying concepts of the present invention and in order not to obfuscate or distract from the teachings of the present invention.

Figure 1:
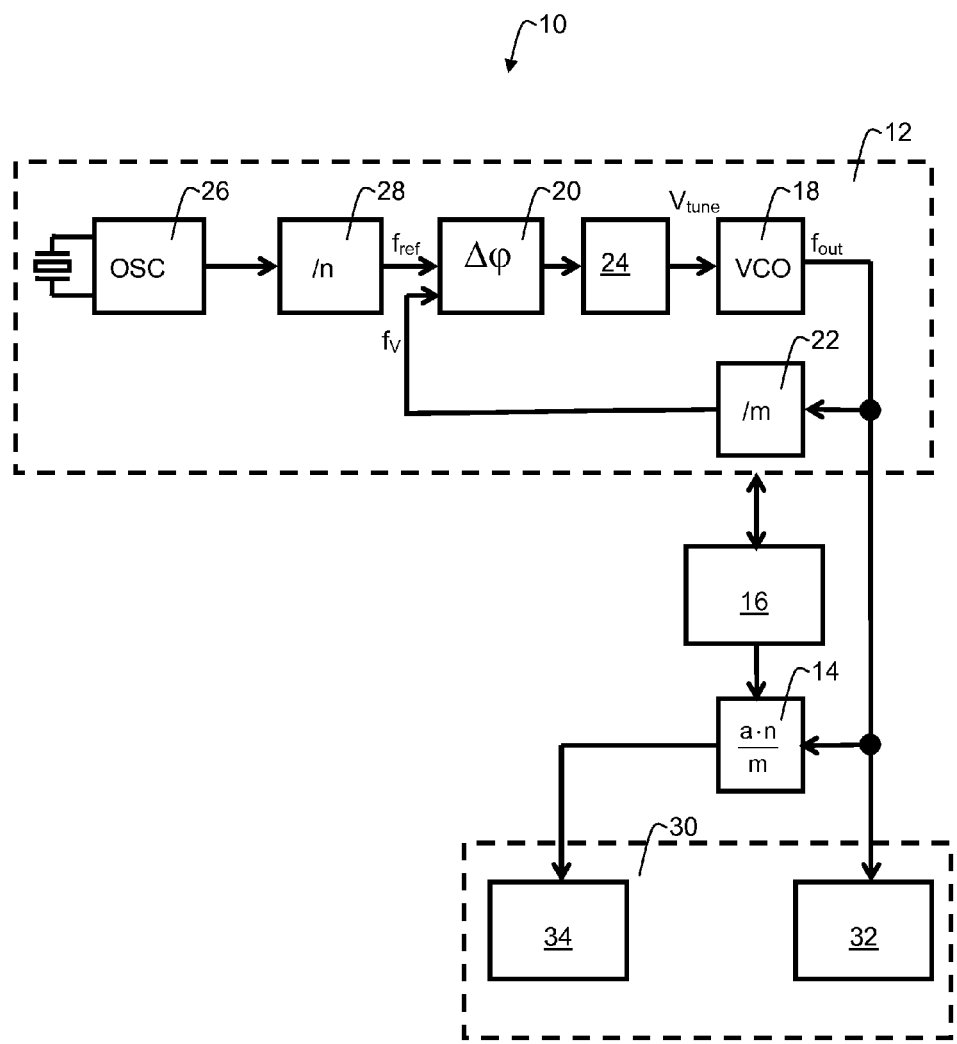
FIG. 1 schematically shows an example of an embodiment of a clock signal generation system.

Referring to FIG. 1, an example of an embodiment of a clock signal generation system is schematically shown. The shown clock signal generation system 10 comprises a clock signal generating circuit 12 arranged to provide a first clock signal having a selectable first clock rate; a divider circuit 14 connected to receive the first clock signal and arranged to generate, depending on a division factor, a second clock signal from the first clock signal, having a constant second clock rate and being synchronized with the first clock signal; and a controller module 16 connected to the divider circuit and arranged to change the division factor when a different first clock rate is selected, to keep the second clock rate constant and the second clock signal synchronized with the first clock signal.

In electronics, especially synchronous digital circuits, a clock signal may be a particular type of signal that oscillates between a high and a low state and may be used to trigger actions of the circuits. For example, a transition from a low state to a high state may be characterized by a rising edge of the clock signal and a transition from a high state to a low state may be characterized by a falling edge of the respective clock signal. In other embodiments, for example, inverse definitions of state transitions may apply.

Clock signals may be considered synchronized when oscillating with a repeating sequence of relative phase angles. Synchronization can be applied, if an integer relationship between frequencies exists, such that the clock signals share a repeating sequence of phase angles over consecutive cycles.

As an example, the second clock signal having a clock rate below a clock rate of the first clock signal may be considered synchronized or isochronous with the first clock signal, when rising and falling edges of the second clock signal correspond to simultaneously occurring rising and falling edges of the first clock signal. And the divider circuit 14 of the clock generation system 10 may, for example, be arranged to provide the second clock signal synchronized with the first clock signal by providing each rising and each falling clock edge of the second clock signal corresponding to a simultaneously occurring rising or falling clock edge of the first clock signal. The shown clock signal generation system 10 may allow to keep the clock rate of the second or periphery clock signal constant while still using synchronous logic design style, although the clock rate of the first or system bus clock signal may be variable and may be changed. The shown system 10 may allow deriving the second or peripheral clock signal, which is fully synchronous to the first or bus clock signal. This synchronized system may enable easy logic design and may avoid using synchronizers for all the communication between the domains triggered either by the first or the second clock signal. Due to the fact, that most peripheral modules 34 use a fraction of the input frequency to the divider circuit 14 or first clock rate to supply the application layer, the input frequency of the first clock signal may be averaged out.

The shown clock signal generation system 10 may allow to generate or synthesize the first clock signal and change the settings of the clock signal generating circuit 12 and thereby change the first clock rate, i.e. the clock rate of the generated first clock signal. For example, this may allow to reduce the first clock rate, which may reduce power consumption of the clock generating circuit and any device connected to receive the first clock signal, without changing the constant second clock rate. The first clock signal may for example be a bus clock signal applied to any processing device connected to the bus.

A term "constant" clock rate may refer to a constant number of clock cycles per second, i.e. it may refer to a fixed clock rate or fixed clock frequency. A constant cock rate may be changed, e.g. by changing multiplier "a" in FIG. 1, but it may not substantially be subject to change when the first clock signal changes, e.g. when the clock signal generating circuit 12 comprises a programmable phase-locked loop circuit and the programming is subject to change.

The shown divider circuit 14 may be arranged to generate the second clock signal from the first clock signal, i.e. the first clock signal may not be used only as a stimulus for actively generating a new second clock signal by means, for example, of a reference oscillator circuit in combination with a synchronization circuit for subsequent synchronization of the second with the first clock signal, but the second clock signal may be generated directly by applying a filter mechanism for transforming the first clock signal into the second. This filter mechanism may be implemented using, for example, counters and clock gates for clock division and clock cycle stealing, i.e. periodically inhibiting a certain amount of clock cycles of the first clock signal from being present in the second clock signal.

The shown divider circuit 14 may comprise or may be implemented as a fractional divider circuit. A fractional divider circuit may, for example, be constructed using two integer dividers, for example a divide-by-n and a divide-by-(n+1) frequency divider circuit. If n is sequentially changed between the two values, the resulting frequency may be the time average of the two frequencies. The exact division ratio may be adjusted by varying the percentage of time the frequency divider spends at the two divider values.

The division factor may comprise a divisor portion and a multiplier portion, which may allow to generate a second clock signal having a second clock rate between zero and the current first clock rate. A fractional divider may or may not be used as the divider circuit when the division factor for generating the second clock rate of the second clock signal is an integer divisor of the first clock rate.

As shown in FIG. 1, the clock signal generating circuit 12 may, for example, comprise a phase-locked loop (PLL) circuit. A PLL basically outputs a signal, which may for example be the first clock signal, having a synthesized frequency, i.e. a local oscillator frequency generated by a voltage controlled oscillator 18 (VCO) having its controlling (or tuning) voltage ($V_{tune}$) driven by a feedback loop. A phase detector circuit 20 fed by a reference frequency $f_{ref}$ and by a variable feedback frequency $f_v$ being the synthesized frequency $f_{out}$, which may correspond to the first clock rate of the first clock signal, divided by a programmable divider 22 (1/m) provides the phase difference of those two inputs to a loop filter 24. This may be a low pass filter that averages the phase error between $f_{ref}$ and $f_v$ and provides the $V_{tune}$ tuning voltage driving the VCO. Once the PLL is locked, the following equation arises: $f_{out}=m \cdot f_{ref}$. The reference frequency may, for example be provided by a reference oscillator circuit 26, which may for example be a quartz oscillator. The reference signal may be provided to the phase detector circuit 20 either directly or, in order to reduce the frequency of the reference signal, through an additional frequency divider circuit 28 arranged to divide the frequency of the signal generated by the reference oscillator circuit 26 by an (integer) factor n.

In another embodiment (not shown), the clock signal generating circuit 12 may comprise a delay-locked loop (DLL) circuit, which can be used to change the phase of a reference clock signal without applying a VCO. A DLL may comprise a delay chain composed of many delay gates connected front-to-back. The input of the chain (and thus of the DLL) may be connected to receive the reference clock signal that is to be negatively delayed. A multiplexer may be connected to each stage of the delay chain and the selector of this multiplexer may be updated by a control circuit to produce a negative delay. The output of the DLL may be the negatively delayed reference clock signal.

In an embodiment, the clock signal generation system 10 may comprise at least a further divider circuit connected to receive the first clock signal and arranged to generate, depending on a further division factor, a further clock signal from the first clock signal, having a constant further clock rate and being synchronized with the first clock signal. And the controller module 16 may be connected to the further divider circuit and arranged to change the further division factor when the different first clock rate is selected, to keep the further clock rate constant. In other words, besides the first clock signal, which may, for example, be the main bus clock signal of an ECU, more than one divider circuits may be used to generate second and further clock signals, for example for providing dedicated constant clock signals to different peripheral devices.

As shown in FIG. 1, the controller module 16 may be connected to the clock generating circuit 12 and may be arranged to select the first clock rate. This may allow the controller module 16 to change the first clock rate. For a PLL, this may for example be achieved by changing the parameters m and/or n. In this embodiment, the controller module 16 may not need to determine the first clock rate or the parameters applied to the clock generating circuit 12, for example, by analyzing the first clock signal. Since these values may be known to the controller module, it may easily determine the corresponding division factor to be applied to the divider circuit 14.

The controller module may, for example, be arranged to determine the division factor by applying a rule for mapping values of the first clock rate to values of the division factor.

The rule may, for example, be a rule for calculating the division factor from known parameters of the clock generating circuit 12. For the example shown in FIG. 1, the division factor may be calculated as "a·n/m", wherein "a" may be an integer multiplier chosen to select a desired constant second clock rate. As another example, the rule for mapping values of the first clock rate to values of the division factor may be implemented in the controller module by means of a look-up table.

As shown in FIG. 1, the clock signal generation circuit 10 may, for example, comprise a electronic control unit 30 (ECU) with at least one peripheral device 34 connected to receive the second clock signal. An ECU 30 may be an embedded system, for example an automotive embedded system for controlling electrical or electronic systems in a vehicle. A peripheral device 34 may be any device except a main processing device receiving the first clock signal, for example serial interfaces, timers, etc. which may require getting a constant clock signal synchronous to the first or system clock signal.

And the clock signal generation system 10 may comprise a microcontroller unit 32 (MCU) connected to receive the first clock signal. As shown, the microcontroller unit 32 may for example be comprised in the ECU 30. The term microcontroller unit 32 may refer to any processor core or processing device or microprocessor with or without having peripheral devices already integrated on-chip with the processing core, receiving the first clock signal as their system clock signal.

Just to give an example, a vehicle, such as a car, a ship, a plane, a train, a helicopter etc. may, for example, comprise at least one clock signal generation system 10 as described above.

The shown clock signal generating system may, for example, allow to change the system clock, i.e. the first clock signal, for the MCU 32 and at the same time allow to keep the second clock for peripheral device 34 constant.

A fractional clock divider circuit may, for example, be used to derive the clock signal for the periphery of an MCU 32. The division factor or division ratio may be adapted to the programming of a clock generating circuit, which may be a system PLL, such that the second clock rate for a peripheral device stays constant regardless of the first clock rate, which may be the bus-clock rate for the MCU 32.

This may allow the MCU 32 to reduce or instruct a controller, such as the controller module 16, to reduce the first clock frequency for power dissipation reduction or performance improvement reasons and enable peripherals 34 like serial interfaces or timers to get a constant second clock signal synchronous to system clock or first clock signal without using non-synchronous clock signals for peripheral devices, which would otherwise add extra logic for synchronizers and would also add a variable latency, depending on the time for performing the synchronization. The presented system may allow for computing power scaling and thermal handling of power dissipation limited applications without the need for building asynchronous on chip peripherals. This may for example reduce the die size and may result in cheaper packages.

Figure 2:
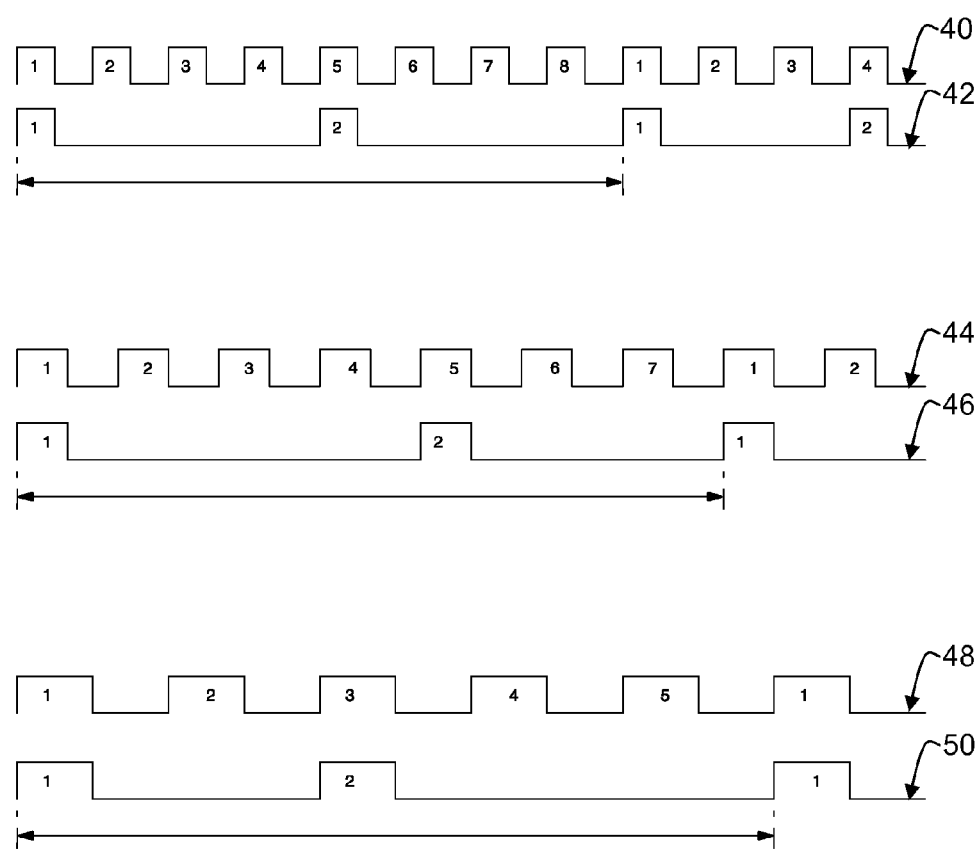
FIG. 2 schematically shows a diagram for illustrating clock signal generation using a fractional divider.

Referring now to FIG. 2, a diagram for illustrating clock signal generation using a fractional divider is schematically shown. Each graph 40, 42, 44, 46, 48, 50 corresponds to a sequence of cycles of the first clock signal 40, 44, 48 and the second clock signal 42, 46, 50 over time, wherein a=1 and n=2. In the shown examples, the first clock signals 40, 44, 48 may comprise frequencies or first clock rates of 8 MHz (ref. num. 40), m=8; 7 MHz (ref. num. 44), m=7; and 5 MHz (ref. num. 48), m=5. Each of the generated second clock signals 42, 46, 50 may have an average second clock rate of 2 MHz. The divider circuit 14 (division factor a·n/m) shown in FIG. 1 may pass a·n=2 clock cycles in a frame of m=8, 7, or 5 clock cycles of the first clock signal, respectively, e.g. by using a clock gate (and a counter). This may be implemented in a dithered way in order to equalize the clock events in the second clock signal.

Figure 3:
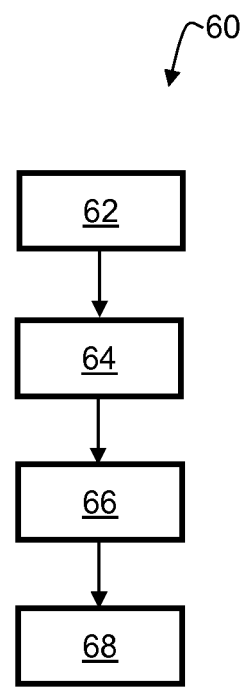
FIG. 3 schematically shows an example of an embodiment of a method for clock signal generation.

Referring now to FIG. 3, an example of an embodiment of a method for clock signal generation is schematically shown. The illustrated method allows implementing the advantages and characteristics of the described clock signal generation system as part of a method for clock signal generation. The shown method 60 for clock signal generation may comprise selecting 62 a first clock rate; providing 64 a first clock signal having the first clock rate; generating 66, depending on a division factor, a second clock signal from the first clock signal, having a constant second clock rate and being synchronized with the first clock signal; and changing 68 the division factor when a different first clock rate is selected, to keep the second clock rate constant and the second clock signal synchronized with the first clock signal.

In an embodiment of the method, the stage of generating 66, depending on a division factor, a second clock signal from the first clock signal, having a constant second clock rate and being synchronized with the first clock signal may comprise generating the second clock signal synchronized with the first clock signal by providing each rising and each falling clock edge of the second clock signal corresponding to a simultaneously occurring rising or falling clock edge of the first clock signal.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

The shown method may, for example, be executed by a clock generation system 10 as shown in FIG. 1. All or at least parts of it, for example the behaviour of the controller module may be provided as a computer program product comprising code portions for executing steps of a method as described above when run on a programmable apparatus.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the controller module 16 may be a separate module or may be comprised in the divider circuit 14, in the clock generating circuit 12, the ECU 30 or the microcontroller unit 32. And the clock signal generation system 10 may for example not comprise an MCU or ECU, but may be comprised within an MCU or ECU.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the clock signal generation system 10 may be implemented as part of a microcontroller unit 32 having on-chip peripheral devices. Alternatively, the examples may be implemented as any number of separate integrated circuits or separate devices interconnected with each other in a suitable manner. For example, the clock signal generation system 10 may not comprise a microcontroller unit 32, but may be connected to the microcontroller unit implemented as a separate integrated circuit.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A clock signal generation system comprising:
   a clock signal generating circuit arranged to provide a first clock signal having a selectable first clock rate;
   a divider circuit connected to receive said first clock signal and arranged to generate, in response to a division factor, a second clock signal from said first clock signal, wherein the second clock signal has a constant second clock rate and is synchronized with said first clock signal; and
   a controller module connected to said divider circuit and arranged to change said division factor when a different first clock rate is selected, to keep said second clock rate constant and said second clock signal synchronized with said first clock signal.

2. The clock signal generation system as claimed in claim 1, wherein said divider circuit is further arranged to provide said second clock signal synchronized with said first clock signal by virtue of being arranged to provide each rising and each falling clock edge of said second clock signal corresponding to a simultaneously occurring rising or falling clock edge of said first clock signal.

3. The clock signal generation system as claimed in claim 1, wherein said divider circuit comprises a fractional divider circuit.

4. The clock signal generation system as claimed in claim 1, wherein said clock signal generating circuit comprises a phase-locked loop circuit.

5. The clock signal generation system as claimed in claim 1, wherein said clock signal generating circuit comprises a delay-locked loop circuit.

6. The clock signal generation system as claimed in claim 1, further comprising
   a further divider circuit connected to receive said first clock signal and arranged to generate, depending on a further division factor, a further clock signal from said first clock signal, wherein said further clock signal comprises a constant further clock rate and is synchronized with said first clock signal; and
   said controller module being connected to said further divider circuit and arranged to change said further division factor when said different first clock rate is selected, to keep said further clock rate constant.

7. The clock signal generation system as claimed in claim 1, wherein said controller module is connected to said clock generating circuit and arranged to select said first clock rate.

8. The clock signal generation system as claimed in claim 1, wherein said controller module is arranged to determine said division factor by applying a rule for mapping values of said first clock rate to values of said division factor.

9. The clock signal generation circuit as claimed in claim 1, comprising an electronic control unit with at least one peripheral device connected to receive said second clock signal.

10. The clock signal generation system as claimed in claim 1, comprising a microcontroller unit connected to receive said first clock signal.

11. A method for clock signal generation, the method comprising
   selecting a first clock rate;
   providing a first clock signal having said first clock rate;
   generating, depending on a division factor, a second clock signal from said first clock signal, having a constant second clock rate and being synchronized with said first clock signal; and
   changing said division factor when a different first clock rate is selected, to keep said second clock rate constant and said second clock signal synchronized with said first clock signal.

12. The method as claimed in claim 11, wherein said generating the second clock signal comprises providing each rising and each falling clock edge of said second clock signal corresponding to a simultaneously occurring rising or falling clock edge of said first clock signal.

13. The method as claimed in claim 11 further comprising:
   generating, depending on a further division factor, a further clock signal from said first clock signal, wherein said further clock signal comprises a constant further clock rate and is synchronized with said first clock signal; and
   changing said further division factor when said different first clock rate is selected in order to keep said further clock rate constant.

14. The method as claimed in claim 11 further comprising:
   determining said division factor by applying a rule for mapping values of said first clock rate to values of said division factor.

15. The method of claim 14 wherein the rule for mapping values comprises:
   calculating said division factor based on known parameters of a clock generating circuit.

16. A method for clock signal generation, the method comprising
   providing, by a clock generating circuit, a first clock signal at a first clock rate;
   determining a first division factor based on the first clock rate of the first clock signal;
   generating, based on the first division factor, a second clock signal from the first clock signal, the second clock signal having a constant second clock rate and being synchronized with the first clock signal;
   providing the first clock signal at a third clock rate;
   changing the first division factor to a second division factor based on the third clock rate of the first clock signal to maintain the constant second clock rate and said second clock signal synchronized with said first clock signal; and
   generating, based on the second division factor, the second clock signal from the first clock signal at the constant second clock rate and being synchronized with the first clock signal.

17. The method as claimed in claim 11 further comprising:
   determining a division factor by applying a rule for mapping values of the first clock rate to values of the division factor.

18. The method as claimed in claim 17, wherein generating the second clock signal comprises:
   providing each rising and each falling clock edge of the second clock signal corresponding to a simultaneously occurring rising or falling clock edge of the first clock signal.

19. The method as claimed in claim 17 further comprising:
   determining a further division factor based on the first clock signal at a further clock rate;
   generating, based on the further division factor, a further clock signal from the first clock signal, wherein the further clock signal comprises a constant further clock rate and is synchronized with the first clock signal; and
   changing the further division factor in response to a different further clock rate of the first clock signal in order to keep the constant further clock rate.

20. The method of claim 17 wherein the rule for mapping values of the first clock rate to values of the division factor comprises:
   calculating the division factor based on known parameters of the clock generating circuit.

* * * * *